US006248409B1

United States Patent
Kim

(12) United States Patent
Kim

(10) Patent No.: US 6,248,409 B1
(45) Date of Patent: Jun. 19, 2001

(54) METHOD FOR MANUFACTURING ANTISTATIC INTEGRATED CIRCUIT TRAYS OF POLYMER MATERIALS USING ION IMPLANTATION

(75) Inventor: Jin-Cheol Kim, Seoul (KR)

(73) Assignees: Bok-Hwan Oh; Ho-Jun Kim, both of Seoul (KR)

( * ) Notice: Subject to any disclaimer, the term of this patent is extended or adjusted under 35 U.S.C. 154(b) by 0 days.

(21) Appl. No.: 09/433,935

(22) Filed: Nov. 4, 1999

(30) Foreign Application Priority Data

Nov. 18, 1998 (KR) ................................. 98-49382

(51) Int. Cl.$^7$ .................................................. C23C 14/12
(52) U.S. Cl. ............................. 427/525; 427/58; 427/96; 427/123; 427/126.4; 427/250; 427/296; 427/531; 427/536; 427/537; 427/569; 427/576
(58) Field of Search ..................... 427/536, 537, 427/58, 123, 126.4, 96, 296, 250, 569, 576, 525, 531

(56) References Cited

U.S. PATENT DOCUMENTS 4,849,082 * 7/1989 Baty et al. .
5,609,969 * 3/1997 Clatanoff et al. .
6,083,567 * 7/2000 Vesnovsky et al. .

FOREIGN PATENT DOCUMENTS 96-2108 10/1996 (KR) .

OTHER PUBLICATIONS

T. Hioki et al., "Electrical and optical properties of ion–irradiated organic polymer Kapton H," Appl. Phys. Lett., vol. 43, No. 1, Jul. 1, 1983, pp. 30–32.

Seok–Keun, Koh, "Thin Film Growth & Surface Modification by K eV Ion Beam," Jpn. J. Appl. Phys., vol. 37, Pt. 1, No. 12B, 1998, pp. 6986, 6987, 6989. (No Month Avail).

N. Hecking et al., "Modelling of Lattice Damage Accumulation During High Energy Ion Implantation," Applied Surface Science 43 (1989), North–Holland, pp. 87–96. (No Month Avail).

J. Davenas, "Influence of the Temperature on the Ion Beam Induced Conductivity of Polyimide," Applied Surface Science 43 (1989), North–Holland, pp. 218–223. (No Month Avail).

S. Scaglione et al., "Modification of Mechanical Properties of e–Gun Evaporated $MgF_2$ and $CaF_2$ Thin Films Under Ion Beam Bombardment," Applied Surface Science 43 (1989), North–Holland, pp. 224–227. (No Month Avail).

G. Compagnini et al., "Hydrogenated Amorphous Carbon Synthesis by Ion Beam Irradiation," Applied Surface Science 43 (1989), North–Holland, pp. 228–231. (No Month Avail).

C. Neelmeijer et al., "Wear Resistant Coatings Produced by $C^+$Implantation," Applied Surface Science 43 (1989), North–Holland, pp. 232–236. (No Month Avail).

* cited by examiner

Primary Examiner—Bernard Pianalto
(74) Attorney, Agent, or Firm—Burns, Doane, Swecker & Mathis

(57) ABSTRACT

A method for providing anti-static characteristics for polymeric, integrated circuit (IC) trays, which allows gaseous ions, such as nitrogen and argon, or metal ions, such as Ti, Li and Al, to be implanted to a surface depth of 1.5 $\mu$m in IC trays. In addition to experiencing no dimensional changes during the antistaticity working, the IC trays have a uniform distribution of ions over their surfaces and range, in surface resistance, from $10^6$ to $10^{12}$ $\Omega/cm^2$.

8 Claims, 4 Drawing Sheets

METHOD FOR MANUFACTURING ANTISTATIC INTEGRATED CIRCUIT TRAYS OF POLYMER MATERIALS USING ION IMPLANTATION

BACKGROUND OF THE INVENTION

The present invention relates, in general, to a method for manufacturing antistatic integrated circuit (IC) trays and, more particularly, to the use of ion implantation in providing antistaticity for IC trays, which enables gaseous ions, such as nitrogen or argon, etc., as well as metal ions, such as Ti, Li, or Al, etc., to be implanted to endow the IC trays of polymer materials with a surface conductivity of $10^6$ to $10^{12}$ $\Omega/cm^2$.

In order to prevent IC chips from being damaged by electro-static charges, plasma deposition techniques are conventionally utilized to deposit a conductive metal, such as Cu, Cr, Ni, Al, etc., on IC trays to a thickness of about 1.5 $\mu m$. Usually, the resulting IC trays come to have a surface conductivity from $10^3$ $\Omega/cm^2$ to $10^5$ $\Omega/cm^2$.

An IC tray manufactured by such a conventional plasma deposition method suffers from the following disadvantages. First, a dimensional change occurs over the entire IC tray entity as a conductive metal is coated on the surface of the IC tray, requiring additional molds to be prepared. Second, the material deposited tends to be worn out by external chemical or physical factors. Third, since the surface conductivity required for the manufacture of antistatic IC trays is set below what is actually required a wasteful time consuming process period and excessive cost are needlessly imposed. Fourth, the deposited materials are apt to secede from IC trays easily. Fifth, too much conductive metal is deposited upon plasma deposition, so that the IC trays cannot be reused owing to a large content of the residual impurities. Sixth, plasma deposition methods cannot utilize gaseous ions such as nitrogen and argon in the provision of antistaticity for IC trays in addition to being problematic in reproductivity because of being greatly affected by process parameters.

SUMMARY OF THE INVENTION

Therefore, it is an object of the present invention to overcome the above problems encountered in prior art and to provide a method for providing high and stable antistaticity for IC trays by implanting a small amount of ions.

It is another object of the present invention to provide a method for manufacturing antistatic IC trays with a great efficiency and economical advantage.

Based on the present invention, the above objects could be accomplished by a provision of a method for providing antistaticity for polymeric integrated circuit trays, in which ions are implanted into the polymeric integrated circuit trays to achieve a surface resistance of $10^6$–$10^{12}$ $\Omega/cm^2$ in the integrated circuit trays. In one embodiment, the ions are sourced from gas selected from the group consisting of nitrogen and argon. In another embodiment, the ions are sourced from a metal selected from the group consisting of Ti, Li and Al.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1:
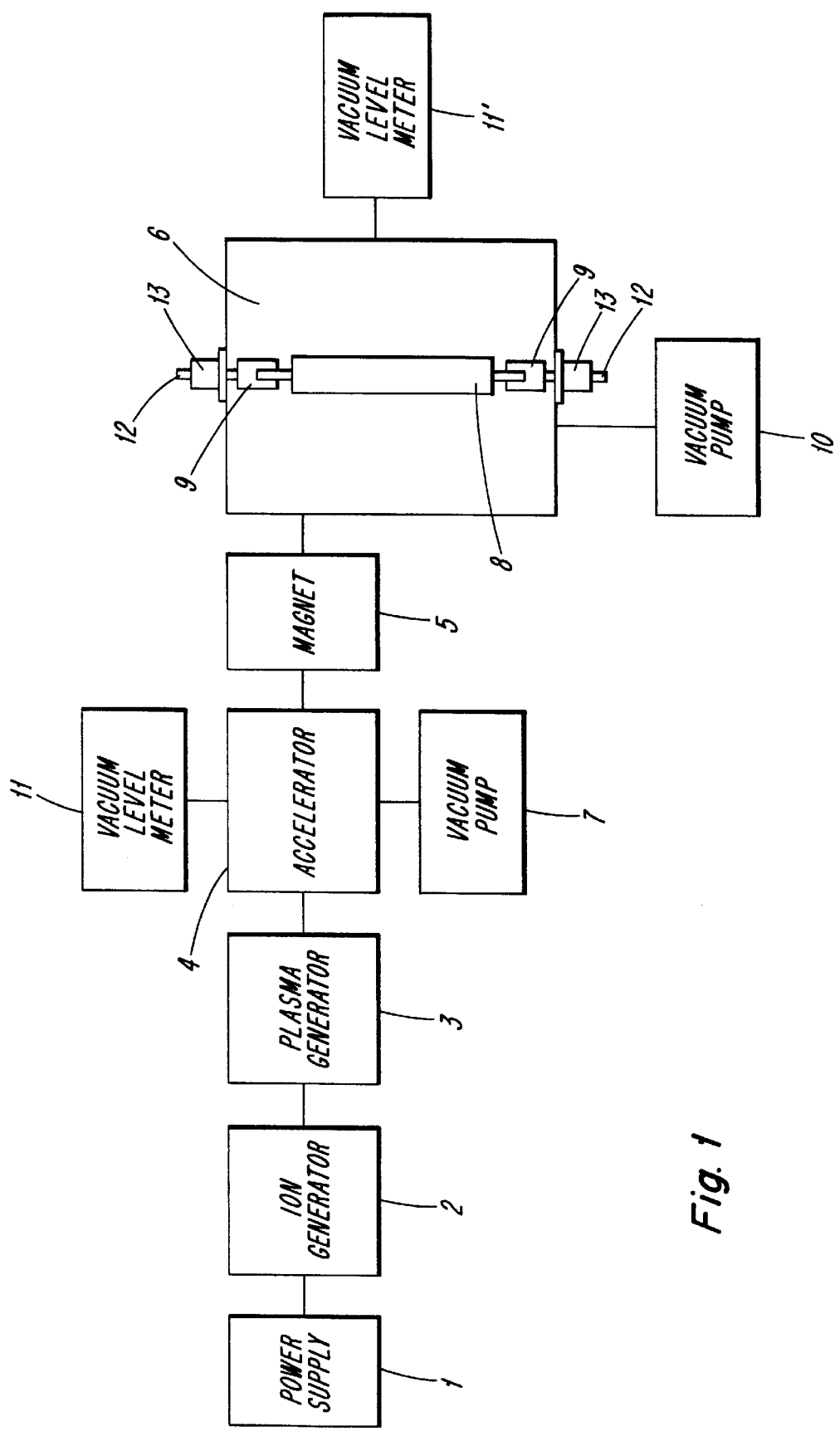
FIG. 1 is a schematic diagram illustrating an apparatus for manufacturing antistatic IC trays by use of ion implantation, in accordance with the present invention.

The application of the preferred embodiments of the present invention is best understood with reference to the accompanying drawings, wherein like reference numerals are used for like and corresponding parts, respectively.

Referring to FIG. 1, there is shown an apparatus for manufacturing IC trays in accordance with the present invention. As shown in FIG. 1, the apparatus comprises a power supply 1 for supplying a power, an ion generator 2 for generating ions, and a plasma generator 3 for ionizing gases. After being accelerated by an accelerator 4, the ions are injected accurately into an IC tray 8 within a vacuum chamber under the control of a deflector (e.g., a magnet) 5. The IC tray 8 is supported by a pair of holders 9 having springs therein and rotated with the aid of a motor (not shown) installed outside the chamber 6. The IC tray is subjected to uniform ion injection while being rotated according to the operation of the motor. The ion generating means 14 constituting an ion generating 2, plasma generating 3, and accelerator 4. The ion generating means 14 and the vacuum chamber 6 are maintained at desired vacuum levels by vacuum pumps 7 and 10 under the monitoring of vacuum level meters 11 and 11', respectively.

In the apparatus, the ion implanting procedure is under collective regulation of a controller (not shown).

Figure 2A:
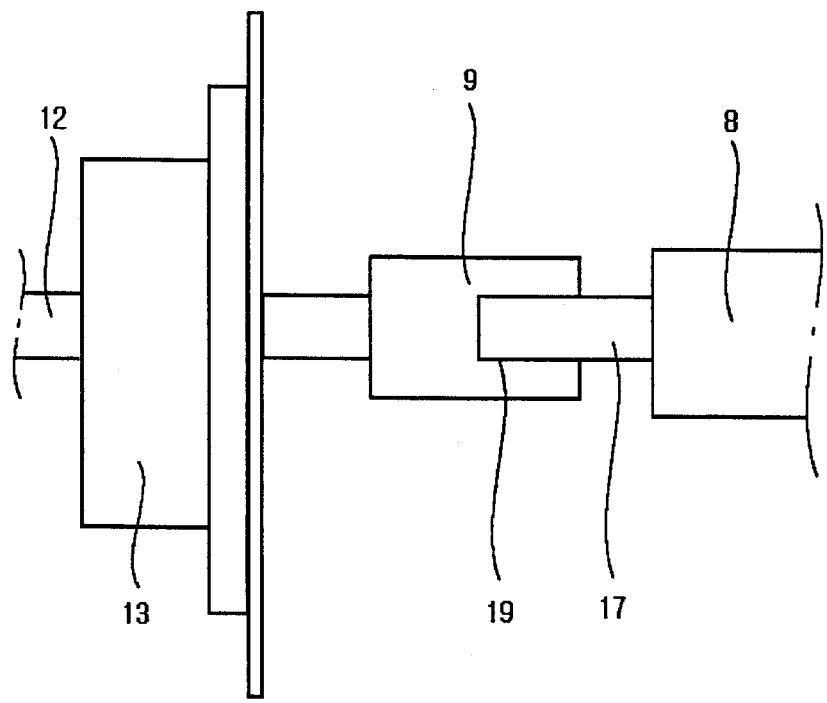
FIG. 2a is a schematic view showing a holder, which is connected to a rotational shaft, supporting an IC tray.
Figure 2B:
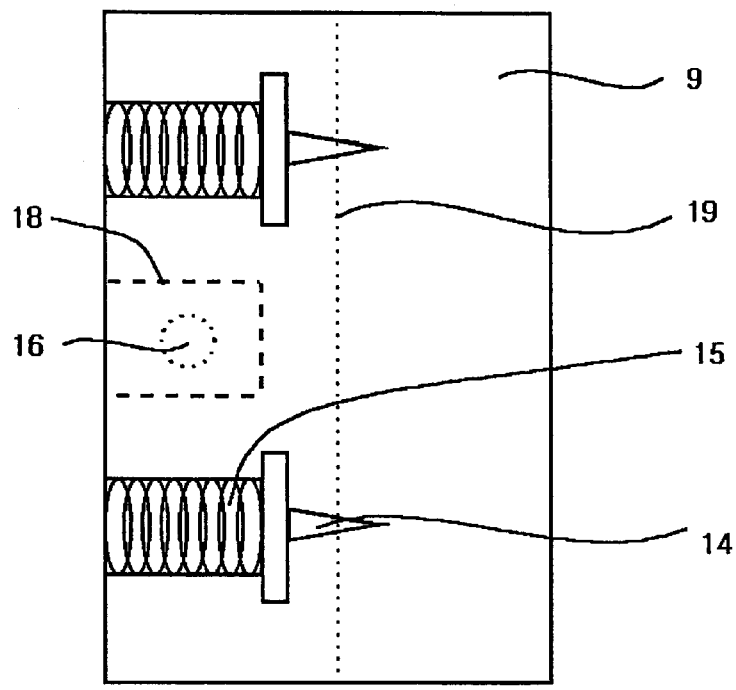
FIG. 2b is a schematic view showing the inner structure of the holder having springs.

With reference to FIGS. 2a and 2b, there are shown the operation and structure of the holder 8.

At a central part in its one side, as seen in these figures, the holder 9 has a trench 18, into which a rotational shaft 12 of the external motor is supported by a bearing 13. Because the IC tray 8 is integrally incorporated in the holder 9, the IC tray 8 is rotated as the rotational force driven by the motor is transferred through the shaft 12 to the holder 9. As mentioned above, the holder 9 is provided with springs. Two elastic springs 15 are installed in one side of the holder 9. In the opposite side of the holder 9, a trench 19, as shown in FIG. 2a, is formed to receive a support 17 for supporting the IC tray. To the end of each of the elastic springs 15, a plastic fixing pin 14 is provided. The plastic fixing pin 14 penetrates through the trench 19 into the end of the support 17, so that the IC tray is firmly fixed by the fixing pins 14 and the support without seceding from the holder upon rotation.

Figure 3:
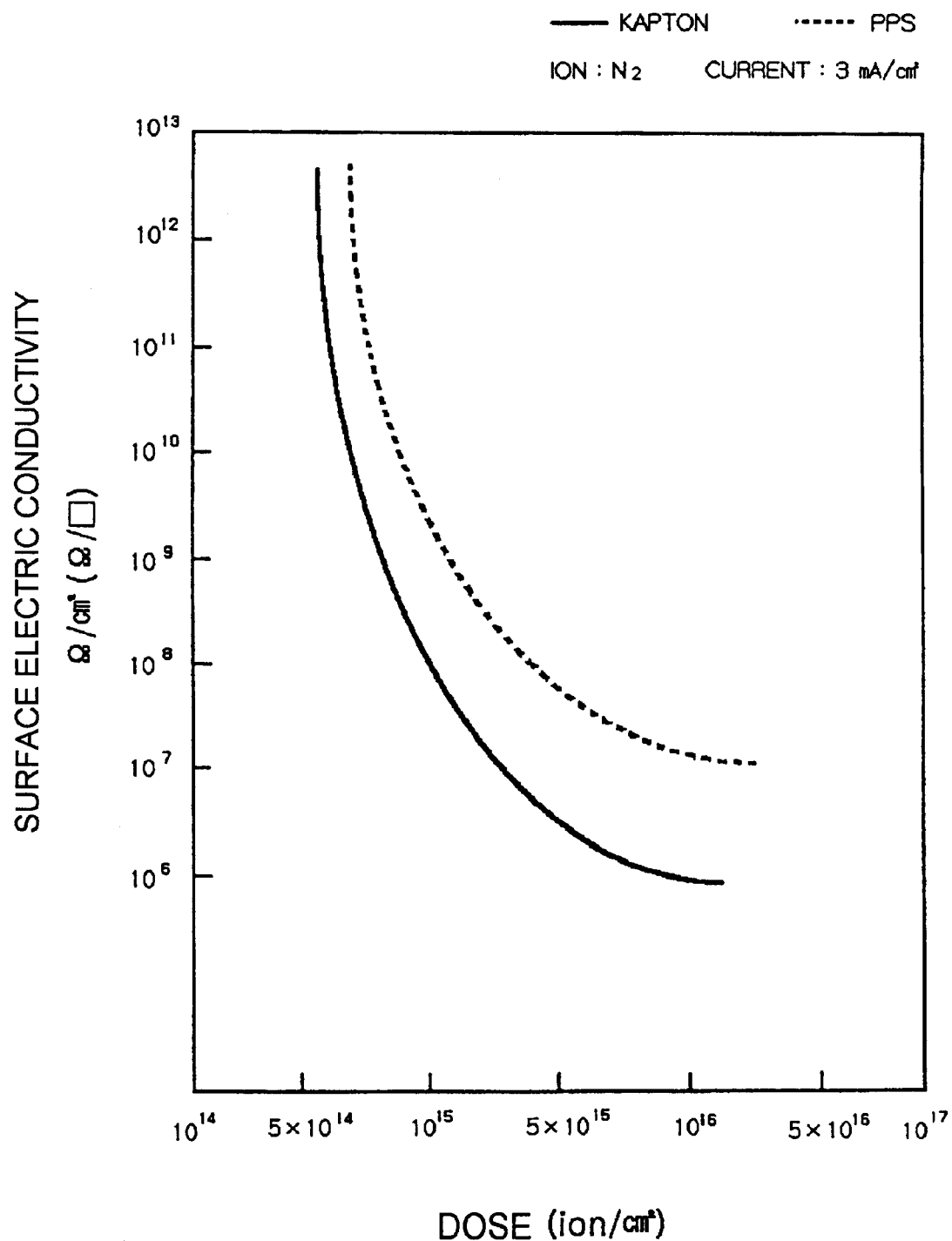
FIG. 3 is a graph showing the relation between surface conductivity and ion dose in IC trays, obtained after nitrogen ions are implanted in the IC trays using ion implantation method.

With reference to FIG. 3, there are shown the relation between surface conductivity and ion dose in IC trays when they are implanted with ions by use of the apparatus described in FIGS. 1 and 2. To examine the relations, nitrogen ions are implanted into IC trays made of KAPTON (a brand name for, a kind of polyimide) and polyphenylene-styrene (PPS) at an acceleration voltage of 190 KeV at a current density of 3 $mA/cm^2$, after which the surface resistance of the IC tray is plotted for KAPTON and PPS with respect to ion implantation dose.

Figure 4:
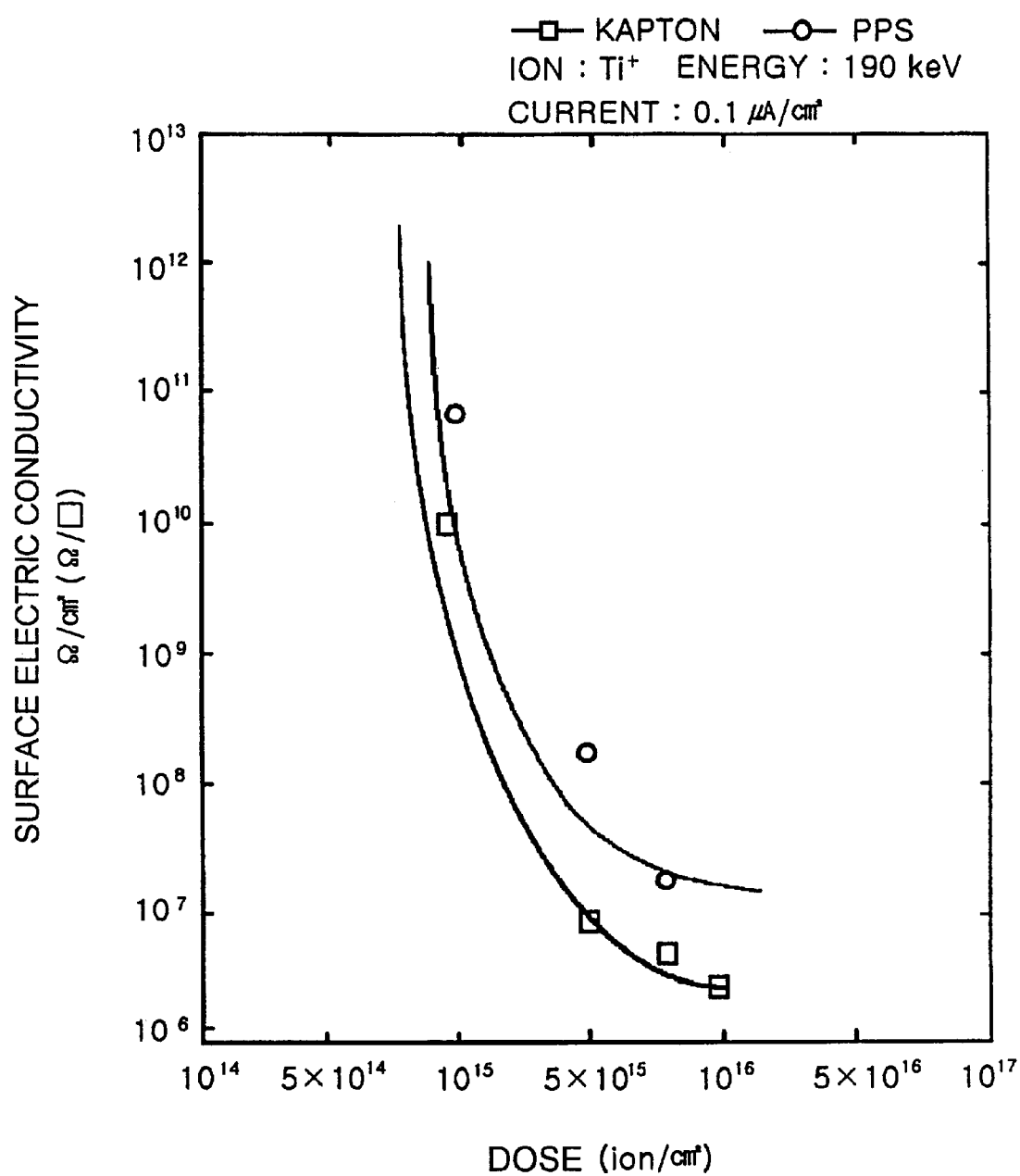
FIG. 4 is a graph showing the relation between surface conductivity and ion dose in IC trays, obtained after $Ti^+$ ions are implanted in the IC trays using ion implantation method.

With reference to FIG. 4, there are shown the relation between surface conductivity and ion dose in IC trays when they are implanted with Ti$^+$ ions at an acceleration voltage of 190 KeV at a current density of 0.1:A/cm$^2$ according to the present invention.

A better understanding of the present invention may be obtained in light of the following examples which are set forth to illustrate, but are not to be construed to limit the present invention. In the following examples, ion implantation was carried out by use of the apparatus described in FIGS. 1 and 2.

EXAMPLE I

Nitrogen gas, serving as an ion source, was introduced into the ion generator and transferred to the plasma generator to produce ions. After being accelerated at an acceleration voltage of 190 KeV in the accelerator, these nitrogen ions were accurately directed, under the control of a deflector 5, to an IC tray within the vacuum chamber. The ions were implanted to a surface depth of about 1.5 $\mu$m at a current density of 3 mA/cm$^2$ in surface of the IC tray. To this end, the vacuum chamber was maintained at a vacuum level of 10$^{-6}$ torr with the aid of the high vacuum pump. In order to achieve a uniform distribution of ions over the targeted surface area of the IC tray, the IC tray is rotated by means of the motor during ion implantation.

The surface conductivity of the IC tray was traced against the dose of ions implanted and the result is shown in the graph of FIG. 3. As seen in the graph, a surface resistance in the minimum level of 10$^{12}$ $\Omega$/cm$^2$, which is indispensably necessary to show antistaticity, and a surface resistance in the level of 10$^8$ $\Omega$/cm$^2$, which is required of the IC trays for extremely fine semiconductor devices, can be obtained easily. In addition, nitrogen ions, which have not been used to provide antistaticity in conventional techniques, can be utilized, thereby reducing the production cost of antistatic IC trays. Further, it is easily conducted to provide IC trays with an effective surface resistance for antistaticity, which usually ranges from 10$^6$ to 10$^{12}$ $\Omega$/cm$^2$.

EXAMPLE II

The same procedure as in Example I was repeated except that Ti was used as an ion source at an acceleration voltage of 190 KeV at a current density of 0.1 $\mu$m/cm$^2$.

The surface conductivity of the IC tray was traced against the dose of ions implanted and the result is shown in the graph of FIG. 4. As seen in the graph, there were similar effects to those when nitrogen was used as an ion source.

As described hereinbefore, the present invention makes it possible to uniformly implant gaseous ions, such as nitrogen and argon, or metal ions, such as Ti, Li and Al, to a surface depth of about 1.5 $\mu$m in IC trays. Thus, the IC trays do not experience any dimensional changes during the provision of antistaticity, so that there is no need to manufacture additional molds. In addition, gaseous ions such as nitrogen and argon, which have not been able to be utilized in conventional techniques, are used to produce effective, antistatic IC trays, enjoying an advantage of being lower in production cost than conductive metals. Further, the implanting of ions in a multi-step manner while varying ion energy conditions, according to the present invention, results in a non-Gaussian distribution of ions over the surface of an IC tray, so that a significant improvement can be brought about in reproductivity as well as in the uniformity of surface conductivity of IC trays. Another advantage of the present invention is that, because ions are injected and distributed within IC tray materials, they show good abrasion resistance against external chemical and physical factors and are improved in surface hardness. Once being implanted according to the present invention, the conductive ions are not seceded from the IC tray. These properties make unnecessary the adhesive testing of IC trays, thereby reducing the testing procedure of IC trays and the production period and cost. To achieve a surface conductivity in an IC tray, the present invention needs impurities at a far smaller amount than do conventional techniques. The IC tray of the present invention can be reused by virtue of a low content of impurities. A uniform distribution of highly pure ions can be attained over the surface of the IC tray at a rapid rate. Consequently, the present invention can manufacture IC trays which are of superior antistaticity, stability and precision.

The present invention has been described in an illustrative manner, and it is to be understood that the terminology used is intended to be in the nature of descriptions rather than of limitation. Many modifications and variations of the present invention are possible in light of the above teachings. Therefore, it is to be understood that within the scope of the appended claims, the invention may be practiced otherwise than as specifically described.

What is claimed is:

1. A method for providing anti-static characteristics for polymeric integrated circuit trays, comprising the steps of:

sourcing gaseous ions from nitrogen or argon or metal ions sourced from Ti, Li or Al; and implanting said sourced gaseous or metal ions into the polymeric integrated circuit trays to achieve a surface resistance of 10$^6$–10$^{12}$ $\Omega$/cm$^2$ in the polymeric integrated circuit trays.

2. A method of providing anti-static characteristics for a polymeric integrated circuit tray, comprising the steps of:

providing an ion generator;

generating a plasma to produce ions; and accelerating said ions to a polymeric integrated circuit tray within a vacuum chamber, such that said ions are implanted into said polymeric integrated circuit tray.

3. A method in accordance with claim 2, wherein said ions are directed by a deflector.

4. A method in accordance with claim 2, wherein said ion source includes gaseous ions.

5. A method in accordance with claim 2, wherein said ion source are metal ions.

6. A method in accordance with claim 2, wherein said tray is rotated during ion implantation.

7. A method in accordance with claim 2, wherein a resulting surface resistance of said polymeric integrated circuit tray is 10$^6$–10$^{12}$ $\Omega$/cm$^2$.

8. A method in accordance with claim 2, wherein said ions are sourced from Ti, Li or Al.

\* \* \* \* \*